United States Patent
Okamura et al.

[11] Patent Number: 6,151,099
[45] Date of Patent: Nov. 21, 2000

[54] APPARATUS FOR EXPOSURE OF PRINTING PLATES USING SIGNALS TO OFFSET IMAGE INCLINE DISTORTION

[75] Inventors: Yuichi Okamura; Chikao Ueda, both of Osaka-fu, Japan

[73] Assignee: Kabushiki Kaisha Kaneda Kikai Seisakusho, Osaka-fu, Japan

[21] Appl. No.: 09/304,260

[22] Filed: May 6, 1999

[51] Int. Cl.[7] ............... G03B 27/58; G03B 27/52; G03B 27/00
[52] U.S. Cl. ............... 355/47; 355/40; 355/18
[58] Field of Search ............... 355/27, 40, 47, 355/52, 18; 347/250, 262; 358/299, 471, 474; 101/463.1

[56] References Cited

U.S. PATENT DOCUMENTS

| | | | |
|---|---|---|---|
| 4,745,487 | 5/1988 | Nishikawa | 358/289 |
| 4,864,326 | 9/1989 | Kawamura et al. | 346/108 |
| 4,897,737 | 1/1990 | Shalev | 358/489 |
| 5,978,010 | 11/1999 | Hosokawa | 347/250 |
| 6,081,316 | 6/2000 | Okamura et al. | 355/18 |

*Primary Examiner*—Russell Adams
*Assistant Examiner*—Hung Henry Nguyen
*Attorney, Agent, or Firm*—Griffin & Szipl, P.C.

[57] ABSTRACT

A recorded image frame is distorted on the printing plate when image information or image data from a computer is recorded in the form of band strips, with a plurality of image elements dotted on each widthwise dotted line of the band, on a printing plate wound over a drum. The present invention permits an undistorted recording on the printing plate by an arrangement which includes a printing plate wound around a drum in the form of a right circular cylinder, an exposing assembly to record image information in the form of a band strip on the printing plate by means of light beam, a moving mechanism to move the exposing assembly in relation to the drum in the direction of the drum axis—by one band width per revolution of the drum—and a circuit to generate an incline distortion offsetting signal in a sawtoothed pattern having the cycle synchronized with that of the rotation of the drum with the initial writing position on the band as starting point. Under this arrangement, this incline distortion offsetting signal is applied to the exposing assembly to gradually move the light beam in the direction opposite to the moving direction of moving mechanism—by one band width per revolution of the drum. This process is repeated until the whole printing image is recorded.

8 Claims, 13 Drawing Sheets

128 Dots

APPARATUS FOR EXPOSURE OF PRINTING PLATES USING SIGNALS TO OFFSET IMAGE INCLINE DISTORTION

FIELD OF THE INVENTION

The present invention relates to an apparatus for the exposure of printing plates. More particularly, this invention relates to an arrangement to record image information on a printing plate wound around a drum according to image signals from a computer.

BACKGROUND OF THE INVENTION

Computer information processing and image data processing technologies have found their way into such fields as news printing and commercial printing, providing a method of drawing an image directly on a printing plate by means of a laser beam according to signals from the computer, without the necessity of photographic film. The printing plate known in the printing industry as PS plate, or pre-sensitized aluminum base plate, is widely used as a printing plate for the purpose.

In the new method, a drum-rotating system known as a facsimile apparatus has been used to draw an image on such a printing plate. Laser beams are applied in the process of image-drawing on the plate wound around the drum. To raise the drawing efficiency, a plurality of beams have come to be used rather than a single beam.

An apparatus such as that mentioned above for drawing an image on the printing plate as shown in FIG. 12 is known as multi-beam system. In FIG. 12, the reference numeral 2 indicates a horizontally positioned drum which is driven and rotated in the direction of an arrow a by a motor M. A printing plate 4 is wound on the outer circumferential surface of the drum 2. Since the printing plate 4 is wound in the form of a right circular cylinder with the starting sideline 6 and the end sideline 8 not shifting from each other, the top line 10 and the bottom line 12 are positioned in parallel to the direction of the drum axis.

Additionally, an optical unit 14 is provided with optical devices in which a laser beam emitting from a laser beam source 16, such as a semiconductor laser, passes through a multi-beam generating element 18 as grating and Wollaston prism to be divided into a multi-beam. This multi-beam then passes through a group of AOM's (acoustical-optical modulators) 20 switch-controlled according to image signals from a computer CM, enters an exposing means provided with a light source array 22 made up of optical fibers, and then is irradiated on the printing plate 4 through a lens 24.

This light source array 22 is one example of the exposing means to directly record an image on the printing plate. An image data is recorded on the printing plate 4 in the form of image band 26 with a band width B corresponding to the width of the multi-beam irradiation. A moving mechanism H is provided to move the optical unit 14 continuously in the direction of an arrow b at a uniform rate by a distance of the band width B per one rotation of the drum, that is, during the time in which drum 2 makes one revolution.

The prior art exposure apparatus has a serious shortcoming. As the drum 2 rotates at a constant velocity, the optical unit 14 or optical system including the exposing means moves continuously by a distance of the band width B for every revolution of the drum. That is, as shown in FIG. 13, the recorded image band 26 shifts by a distance equivalent to the band width B for every revolution of the drum and forms a spiral band around the printing plate 4. Unwound and opened, the printing plate 4 has a recorded image made up of a number of band strips, but the completed image frame is a parallelogram with the bottom line shifted from the top line by the band width B because the image band is recorded in the form of a spiral. The printing plate 4 with a recorded image frame 28 distorted with respect to the printing plate 4 is not suitable for printing.

If, for example, a 128-beam light source array 22 is adopted for a newspaper printing plate with a drum circumference of 46 inches and an image element density of 909 dots/inch, then the band width B, which corresponds to 128 image elements, is 128/909=0.14 inch or 3.6 mm. Because of the spiral recording, the top line 28c and the bottom line 28d of the recorded image 28 shift from each other by 3.6 mm, which shift is visually apparent. In addition, the angle $\theta$ of inclination, calculated from tan $\theta$=0.14/46, is 0.17 degrees. That is, the starting sideline 28a and the end sideline 28b will have an inclination of 0.17 degrees, though they are parallel to each other.

As a way to avoid this distortion of the Image, an intermittent moving method as outlined in FIG. 14 was proposed. In this method, the optical unit 14 is left standing while the drum 2 makes a revolution for recording the image. Thereafter, the optical unit 14 is moved by a distance of the band width B by means of a moving mechanism H. The time for the movement has to be set to an integral multiple of the time needed for the drum to make a revolution. This intermittent moving system allows the image band 26 to form a right cylinder shape without spiralling. Thus the image 28 is recorded on the printing plate 2 in the form of a right quadrangle without distortion. The problem is, however, that intermittent moving lengthens the total exposure time significantly, lowering the efficiency of platemaking work. Furthermore, repeated moving and stopping of the heavy optical unit makes the apparatus complicated and expensive, and can cause vibration, leading to deterioration of image quality and to mechanical trouble.

SUMMARY OF THE INVENTION

It is an object of the present invention to provide a printing plate exposure apparatus that solves those problems. This object is attained by providing an apparatus for the exposure of printing plates utilizing image incline distortion offsetting signals. More particularly, this invention provides an arrangement to record image information spirally in the band width of a plurality of image elements on a printing plate wound around a drum, which comprises a printing plate wound around the drum in a right cylindrical form, an exposing means to record image information on the printing plate by means of optical beam, a moving mechanism to continuously move the exposing means in relation to the drum in the direction of the drum axis by a distance of one band width per revolution of the drum, and a circuit to generate an image inclinedistortion offsetting signal in a sawtooth-wave pattern with the same cycle as that of the revolution of the drum with the beginning of recording or writing on the band as starting point, wherein this image incline distortion offsetting signal is applied to the above-mentioned exposing means to deflect the optical beam in sequence in the opposite direction to the moving direction of the moving mechanism until the light beam is distorted by one band width per revolution of the drum, thereby recording the image information free from distortion with respect to the printing plate.

The above-mentioned incline distortion of the band is produced because the optical unit, that is, the exposing means, moves by a band width in relation to the drum in the direction of the drum axis while the drum makes one revolution. After extensive study to find a way to eliminate the incline distortion of the band, it was discovered that the problem was that the direction in which the light beam is directed from the exposing means to the printing plate is fixed. It was found that the incline distortion of the band can be obviated if the light beam from the exposing means is deflected continuously in the direction opposite to the movement of the exposing means by one band width for every revolution of the drum. That is, if the light beam is deflected continuously and gradually such that a distance of deflection is equal to a band width when the drum has completed one revolution, the inclination can be offset by the deflection. The deflection is reset at zero each time the starting point of recording on the next band comes around at the completion of one revolution of the drum. Repeating this process prevents the entire recorded image from getting inclined and distorted.

With a drum of 46 inches in circumference as mentioned earlier, the band has 46 ×909=41,814 dots in the longitudinal direction. If the light beam is to be deflected sideways by 3.6 mm at completion of every revolution of the drum, it will mean that every dot is deflected sideways by $8.6 \times 10^{-5}$ mm with respect to the dot preceding it in the longitudinal direction. This deflection may be effected 41,814 times for every drum revolution either by analog signals continuously or by digital signals. For the purpose of this specification, thissignal has been and shall be referred to as "incline distortion offsetting signal."

Dotting or recording on the printing plate by light beam or exposing the printing plate to light beam is performed by either a multi-beam system or a single beam system. The multi-beam system involves recording simultaneously the entire 128-dot band width, while the single beam system records 128 dots one by one in each widthwise scanning.

In the multi-beam system, a vibration mirror is used as an exposing means in deflection operation. Incline distortion offset signals are input to this vibration mirror to vibrate the vibration mirror in proper amplitudes, with one drum revolution as one cycle. In this way, the indine distortion of the recording band is offset.

The single beam system uses an acoustical-optical deflector (AOD), which is controlled with an electric signal, as an exposing means. Because the band width has 128 dots, the deflection signal in which the 128-dot band width is one cycle is integrated with the incline distortion offset signal to produce a synthesized signal. The acoustical-optical deflector is controlled with this synthesized signal.

DESCRIPTION OF PREFERRED EMBODIMENTS

EXAMPLE I

Figure 1:
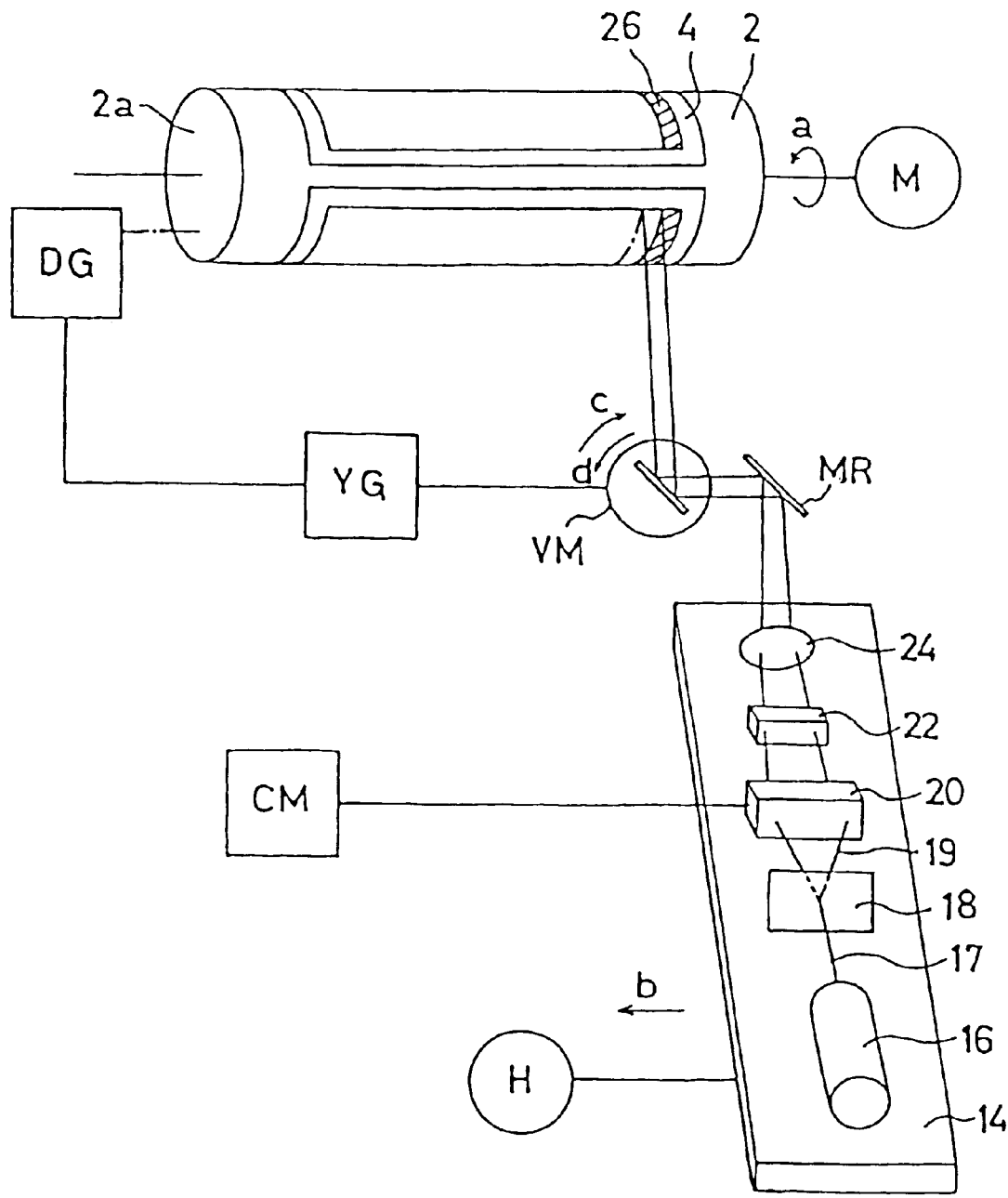
FIG. 1 is a schematic diagram of a multi-beam system as a first example of a printing plate exposure apparatus using incline distortion offsetting signals according to the present invention.

FIG. 1 is a schematic diagram of the multi-beam system in the first example of the present invention. Laser beam 17 emitted from laser beam source 16 mounted on optical unit 14 is split by multi-beam generating element 18 into, e.g., 128 rays to form a multi-beam 19. This multi-beam, switch-controlled by a group of AOM's (acoustical-optical modulators) 20 with an image signal from computer CM, takes in image information. Multi-beam 19 passes through a light source array 22 made of a large number, e.g., 128 strands of optical fiber, then is converged by a lens 24. The multi-beam 19 is then reflected on a mirror MR and then on a vibration mirror VM and records an image band 26 on the printing plate 24.

A drum standard position signal generating circuit DG produces a pulsed drum standard position signal at the start of recording each band 26. The principle is that a mirror (not shown) is attached to one end face 2a of the drum 2 and a laser beam is irradiated on end face 2a of the drum so that each time drum 2 completes one revolution, the beam reflected on the mirror produces a pulse. As an alternative to this light signaling, known techniques, including electromagnetic pulse and rotary encoder, may be used.

A sawtooth-wave incline distortion offsetting signal generating circuit YG is first reset by a pulse from drum standard position signal generating circuit DG. Then as the voltage rises from zero, vibration mirror VM rotates on receipt of that signal in the direction of an arrow c. As the drum 2 rotates in the direction of an arrow a, the image band on the printing plate extends in the direction of the circumference while gradually shifting sideways to the right. This shift to the right is effected by the vibration mirror VM rotating in the direction of an arrow c while moving along with optical unit 14 in the direction of an arrow b. Thus, the distortion of the band 26 is offset. The instant circuit YG receives the next pulse from circuit DG when drum 2 has completed one revolution, the circuit YG will be reset with the voltage dropping to zero. Hence, the vibration mirror VM instantly rotates in the direction of an arrow d to the starting point to start the recording of the next band 26. This process will be described in more detail with reference to FIG. 2 and FIG. 3 in the following discussion.

Figure 2:
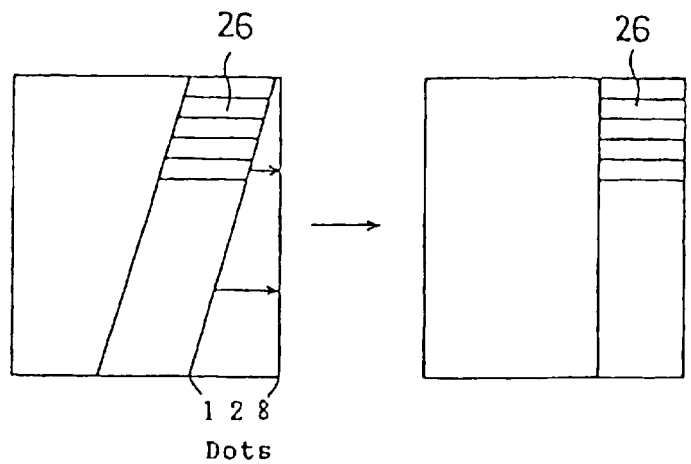
FIG. 2 is a schematic illustration showing the correction of an inclined band strip (exaggerated for emphasis).

With a fixed vibration mirror VM, an inclined band 26 is formed as the left image in FIG. 2. To remove the incline distortion, the light beam must be deflected in the recording or dotting process in the direction of the arrow shown in the drawing. This deflection is effected through rotational vibration of the vibration mirror VM. With that, a straight recording band strip is formed as the right image in FIG. 2.

Figure 3:
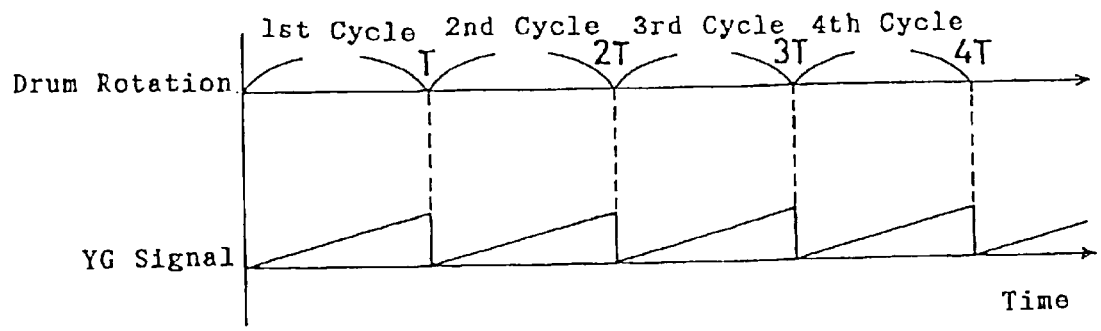
FIG. 3 is a diagram depicting a sawtooth form pattern of the incline distortion offsetting signal (YG signal) in a first example of the present invention.

FIG. 3 shows a pattern of the YG signal, that is an incline distortion offsetting signal. The rotational cycle of the drum 2 is given as T. The YG signal is a sawtooth-wave that vibrates in the same cycle T. The starting point of recording on the band is the standard position with the YG signal at zero. As the drum rotates, the voltage is gradually raised, and when one revolution of the drum is completed, the YG signal is reset to zero. This YG signal controls the vibration of the vibration mirror VM.

Figure 4:
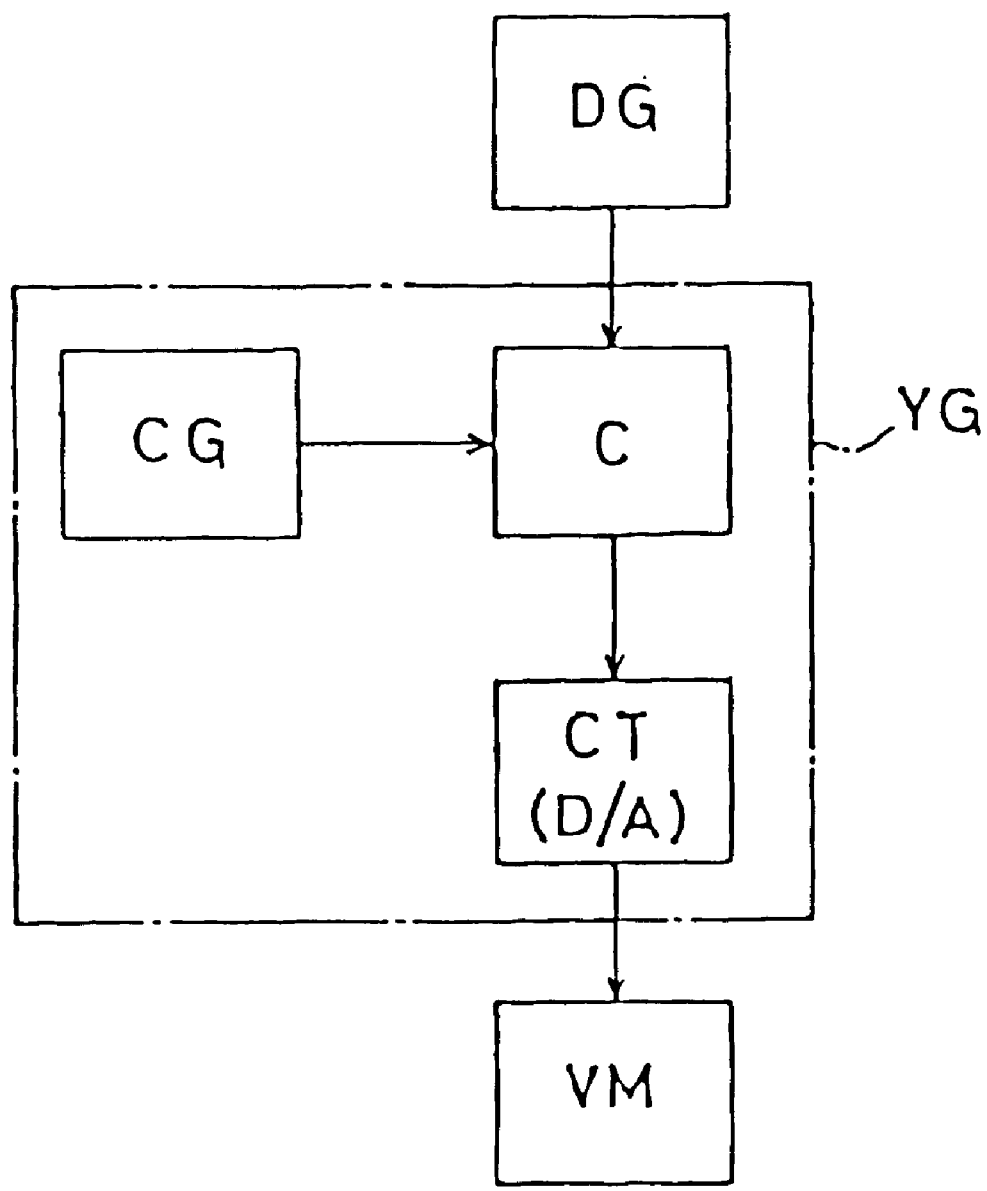
FIG. 4 is a block diagram of the first example.

FIG. 4 is a block diagram of the signal system. Counter C is reset by the pulse of the drum standard position signal generating circuit DG. While counting the pulses from the standard clock generator CG, the counter C transmits the pulse count to a pulse count-voltage transducer CT. This transducer CT is a D/A converter which outputs to the vibration mirror VM a voltage proportional to the pulse count. In the present example, the incline distortion offsetting signal generating circuit YG is made up of the standard clock generator CG, counter C, and pulse count-voltage transducer CT. The circuit DG may be included in the circuit YG as constituent element.

Figure 5:
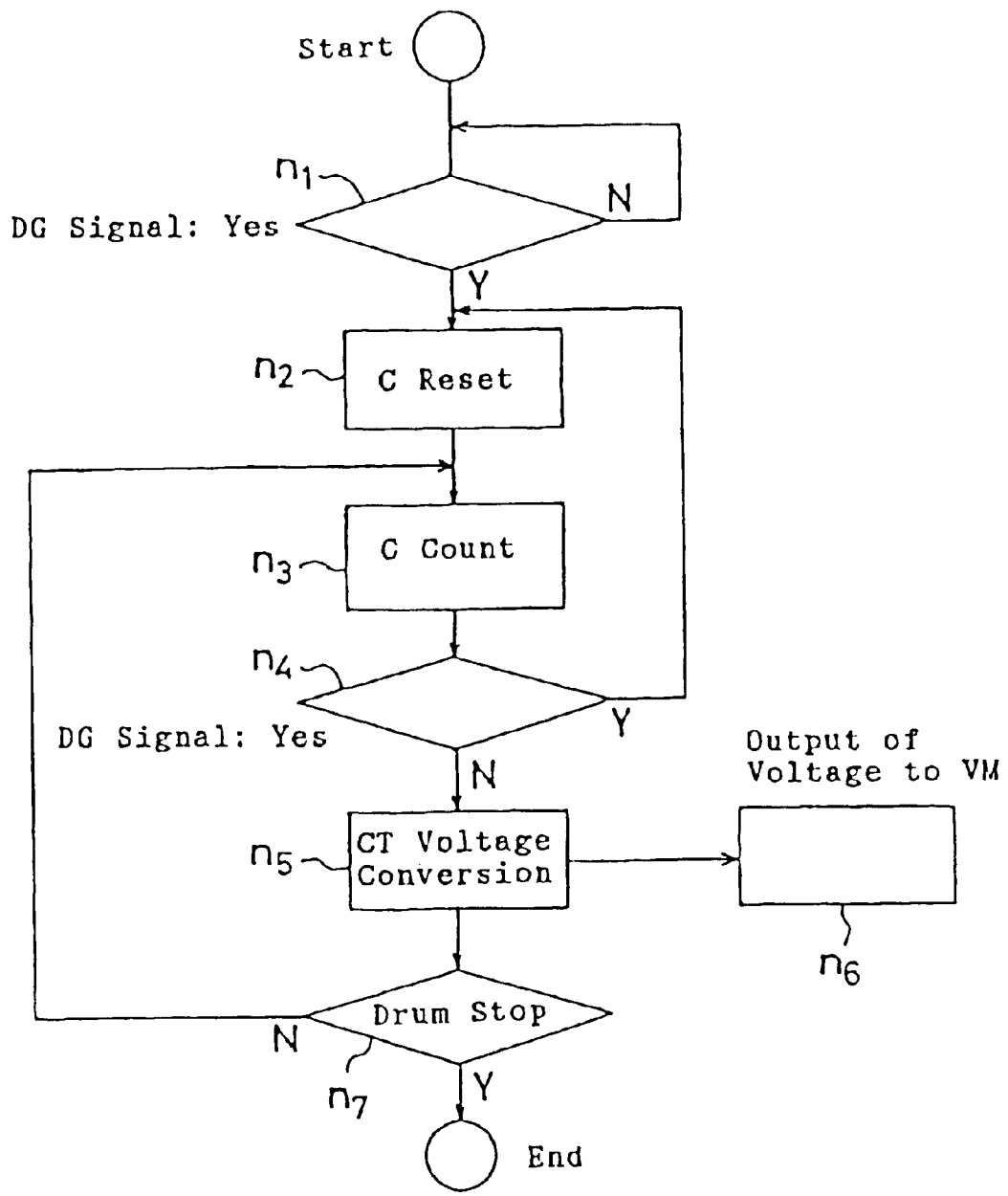
FIG. 5 is a flow chart showing the process in the block diagram of the first example.

FIG. 5 is the flow chart showing the process in the aforesaid block diagram. The circuit DG generates a pulse in Step n1. The counter C is reset in Steps n2–n3 and starts immediately to count the clocks from the clock generator CG. Then, until the next DG signal is transmitted (Step n4), the voltage transducer CT generates a voltage proportional to the pulse count (Step n5). This voltage is output to the mirror VM (Step n6) to deflect the same. As long as the drum is not stopped in Step n7, namely if dotting or recording is not over, return to Step n3 is effected to increase the voltage and to further deflect the mirror VM. Meanwhile, when the drum completes one revolution or its one cycle and the DG circuit outputs a pulse (n4), the counter C is reset to zero to restart counting.

In the present example, the sawtooth-wave incline distortion offsetting signals are controlled using a counter. A known electronic circuit may be used in place thereof.

EXAMPLE II

Figure 6:
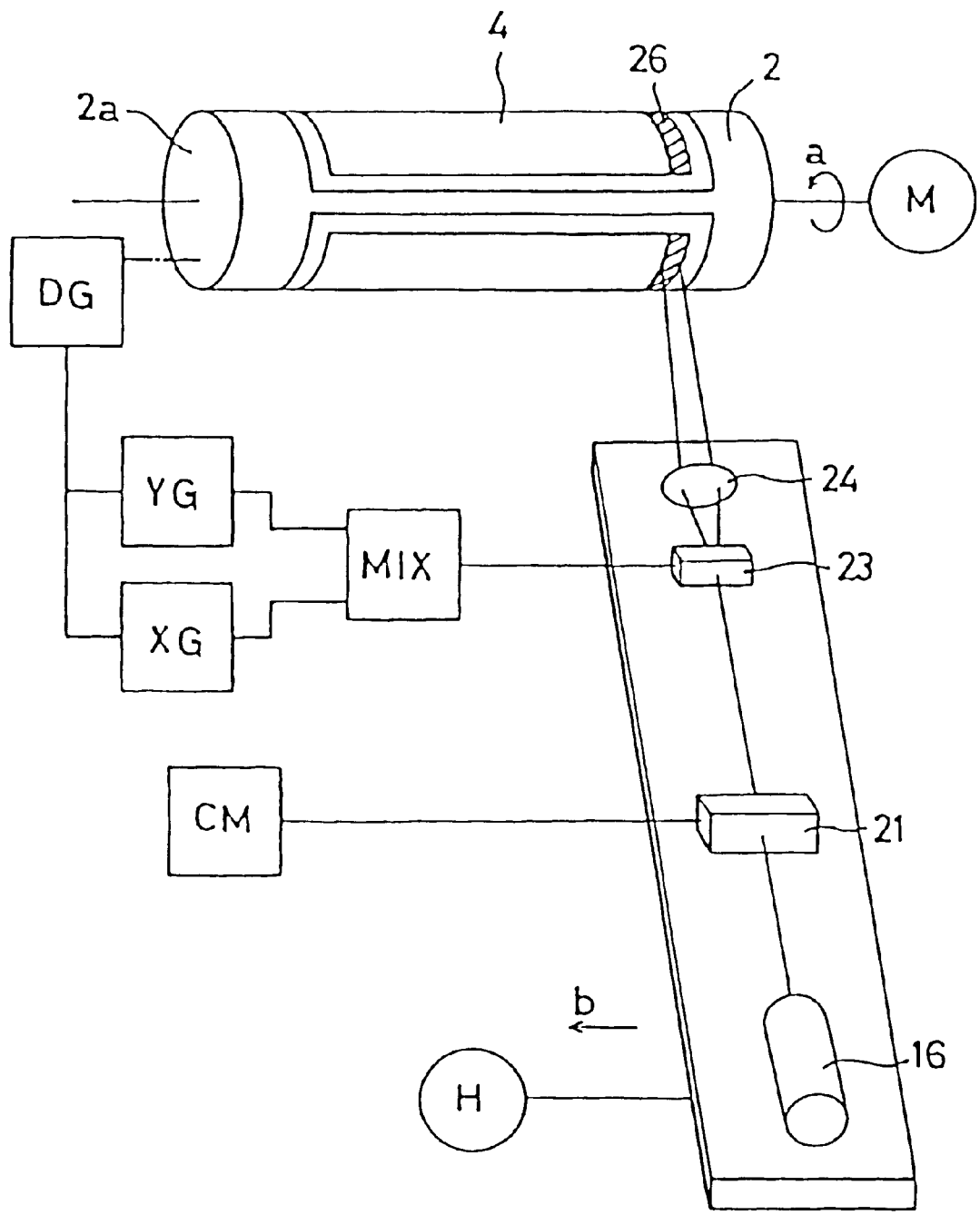
FIG. 6 is a schematic diagram showing the single beam system in a second example of the present invention.

FIG. 6 is a schematic diagram of a second example of the present invention in which a single beam system is adopted. The parts which correspond to those in FIG. 1 are identified with common reference numerals or symbols. Emphasis is placed on the different parts in the following description.

A laser beam emitted from laser source 16, switch-controlled by AOM (acoustical-optical modulator) 21 with an image signal from computer CM, enters AOD (acoustical-optical deflector) 23, an exposing means in the present example. Deflected by this AOD 23, the laser beam records and forms an image band 26 on the printing plate 4 through a lens 24.

In FIG. 6, the functional description of drum standard position signal generating circuit DG and incline distortion offsetting signal generating circuit YG is omitted, because it is the same as in Example I. The outstanding difference of this example from the previous one is that a single beam is adopted. That is, image data is recorded dot by dot, that is, simultaneous band-wide recording of, for example, 128 dots is not effected. Therefore, this single beam system is provided with a band forming signal generating circuit XG which generates a sawtooth-wave with a cycle corresponding to one band width.

It is to be understood that this sawtooth-wave is called a band forming signal in the present specification. This signal is input to AOD 23 to gradually deflect the laser beam from right to left over the bandwidth, comprising for instance 128 dots, for recording 128 dots. The instant the 128th dot is recorded, the band forming signal drops to zero, and the laser beam returns to the right side end and restarts recording the next bandwidth of 128 dots.

If the band strip has, for example, 41,814 dots in the longitudinal direction of the band strip as mentioned earlier, band forming signals comprising sawtooth waves for 41,814 cycles will be needed to form one whole band strip. On the other hand, the incline distortion offsetting signal generating circuit YG has to form only one sawtooth wave of one cycle per one whole band strip. That is, 41,814 cycles of XG signal exist for one cycle of YG signal. That will be explained in greater detail below with reference to FIGS. 7 and 8.

Figure 7:
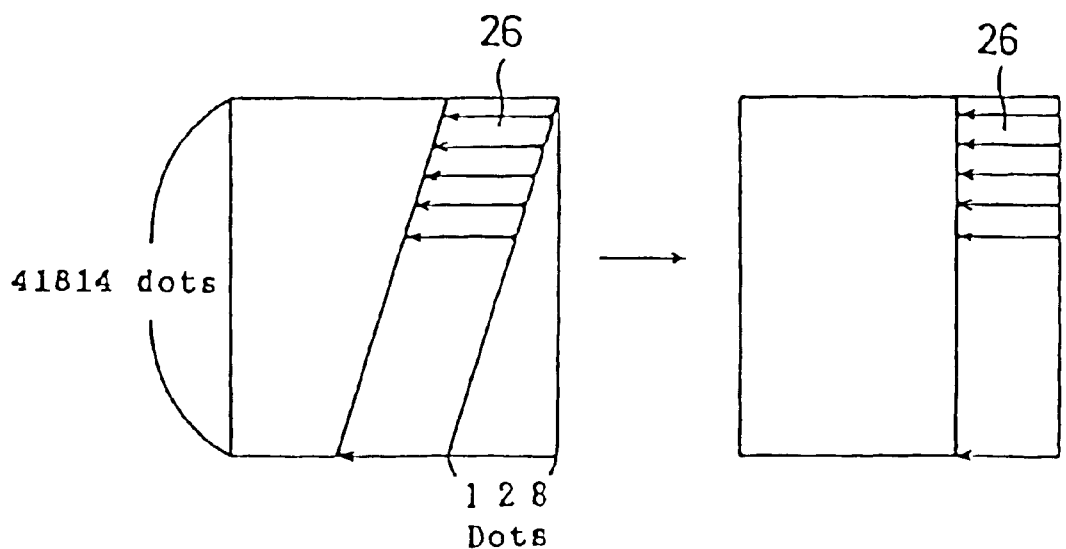
FIG. 7 is a schematic illustration showing the correction of a recorded image (exaggerated for emphasis).

Without YG signals, a tilted band 26 is formed, as the one shown (exaggerated for clarity) at the left in FIG. 7. An widthwise arrow forming a single element of the band 26 is formed in one cycle of XG signal. One band has 41,814 of such widthwise arrows in the longitudinal direction. With YG signals as applied in the present invention, the starting point of each arrow forming the band 26 is deflected sequentially to the right. As a result, the incline distortion is removed and a vertical band strip is produced as shown at the right in FIG. 7. In practice, the DG signal-synchronized XG signal and YG signal are mixed in a mixing circuit MIX. This MIX signal is applied to AOD 23 to control and deflect the laser beam.

Figure 8:
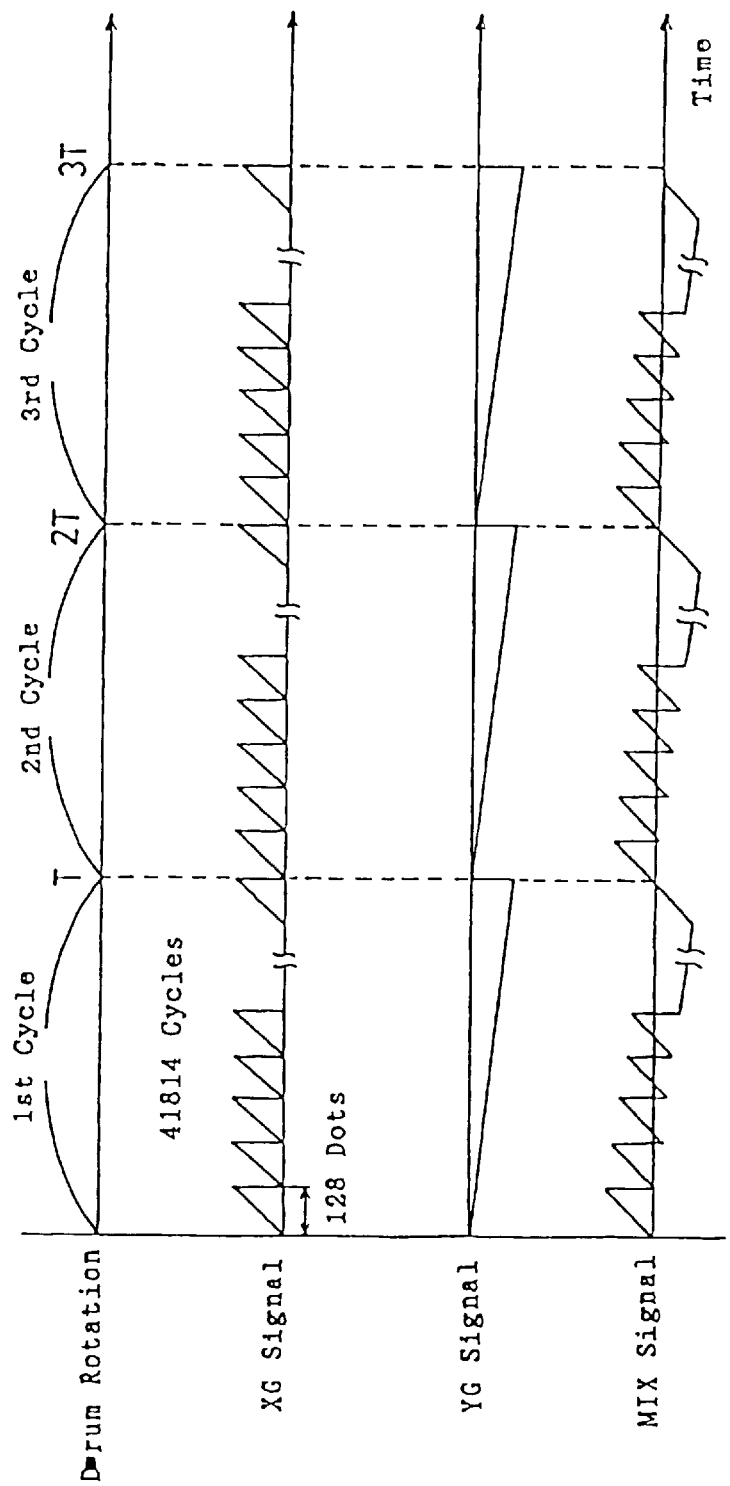
FIG. 8 is a diagram depicting a sawtooth form pattern of different signals.

FIG. 8 shows sawtooth-wave patterns of XG signal, YG signal, and MIX signal with drum rotational cycle T serving as a standard. It should be understood that since the direction of movement of AOD 23 (exposing means) is indicated by an arrow b, when deflecting the laser beam, the leftward direction identical to the moving direction is indicated as plus and the opposite, rightward direction as minus.

One cycle of XG signal corresponds to 128 dots in the widthwise direction of the band, while one cycle of YG signal has 41,814 cycles of XG signal. Furthermore, the maximum amplitude of XG signal is equal to that of YG signal. The mixture of the two signals, that is MIX signal, returns to the initial state of zero each time the drum completes one revolution. In other words, the starting point of each cycle of XG signal is moved back by YG signal to offset the incline distortion. After the last dot of the band is recorded, the laser beam returns to the initial position of the next band.

Figure 9:
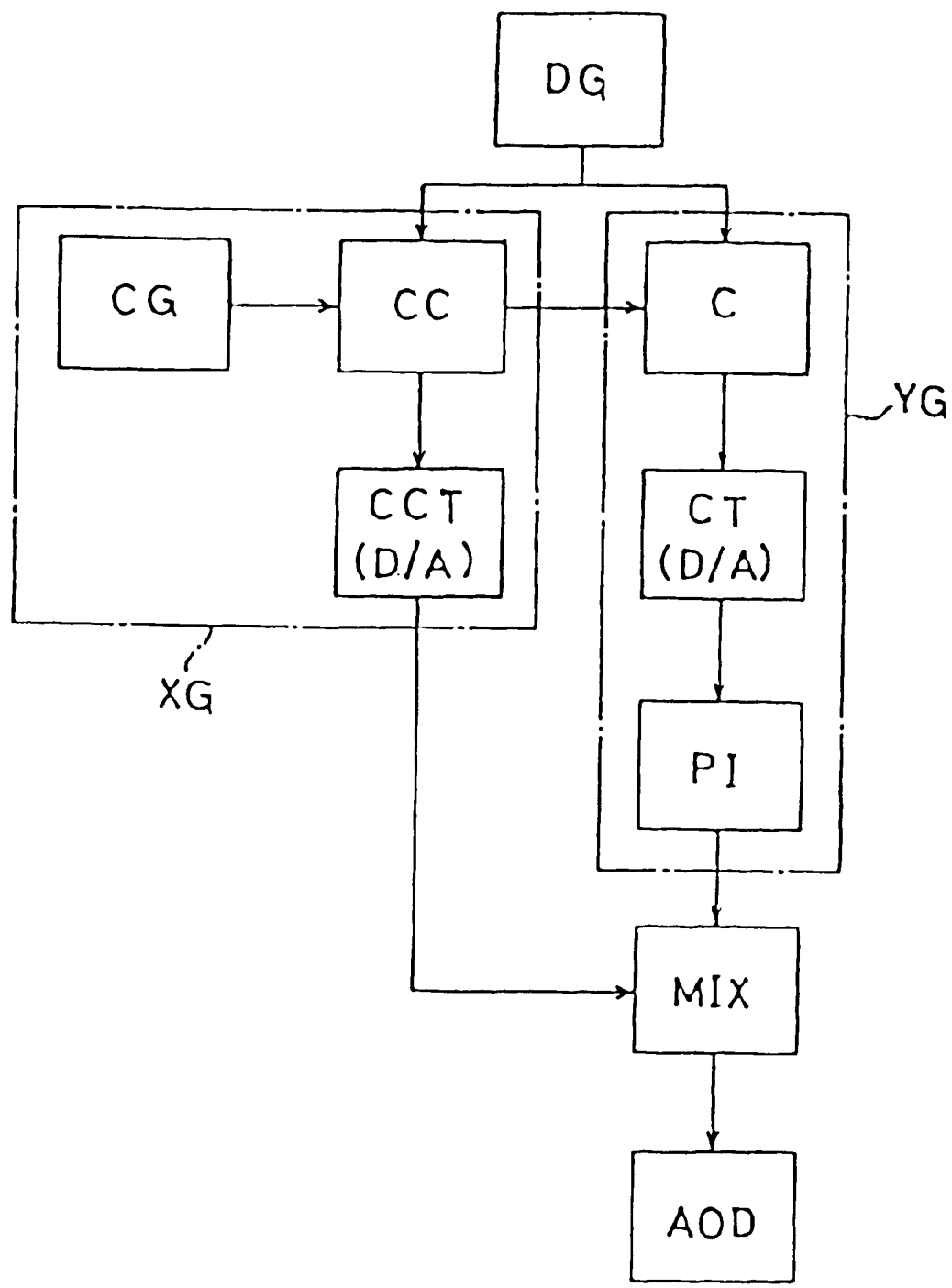
FIG. 9 is a block diagram of the second example.

FIG. 9 is a block diagram of the signal system. The band forming signal generating circuit XG is formed of a standard clock generator CG, a counter CC, and a pulse count-voltage transducer CCT. On the other hand, the incline distortion offsetting signal generating circuit YG includes a counter C, a pulse count-voltage transducer CT, and a polarity inverter PI. The counters C and CC both are reset by pulse from the circuit DG which gives the starting position of recording on the band. The output of the pulse count-voltage transducer CCT becomes the output of the circuit XG, and the output of the polarity inverter PI becomes the output of the circuit YG. The outputs of the circuits XG and YG are mixed in the mixing circuit MIX, and the mixed signal is input in the exposing means, that is AOD.

Figure 10:
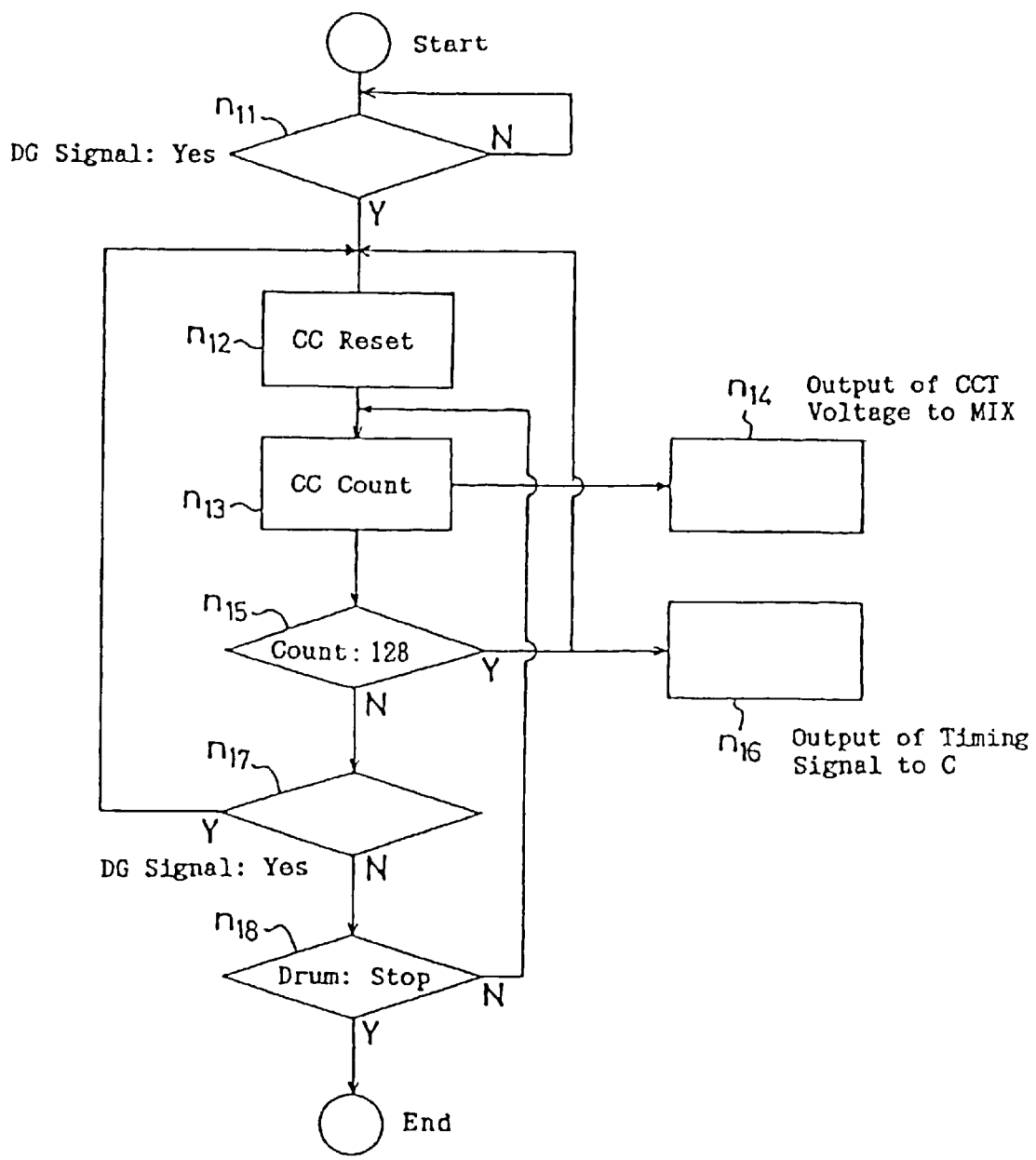
FIG. 10 is a flow chart showing the process in a band forming signal generating circuit XG of the second example.

FIG. 10 is a flow chart of the process in the band forming signal generating circuit XG. If there is a DG signal in Step nil which gives a position to start recording on the band, the counter CC is reset (n12) and counts the pulses from the standard clock generator CG (n13). A voltage proportional to that count is output from the pulse count-voltage transducer CCT to the mixing circuit MIX (n14). When the count reaches the full number of dots of the band that is 128 (n15), one pulse of timing signal is output to the counter C in the circuit YG (n16). At the same time, the counter CC returns to Step n12 and restarts to count up to 128. This way, sawtooth waves are formed one after another. When a next DG signal comes up (n17) with the drum completing one revolution, return to Step n12 is effected again. When recording on the whole printing plate is over, the drum comes to a stop (n18), bringing the process to a close.

Figure 11:
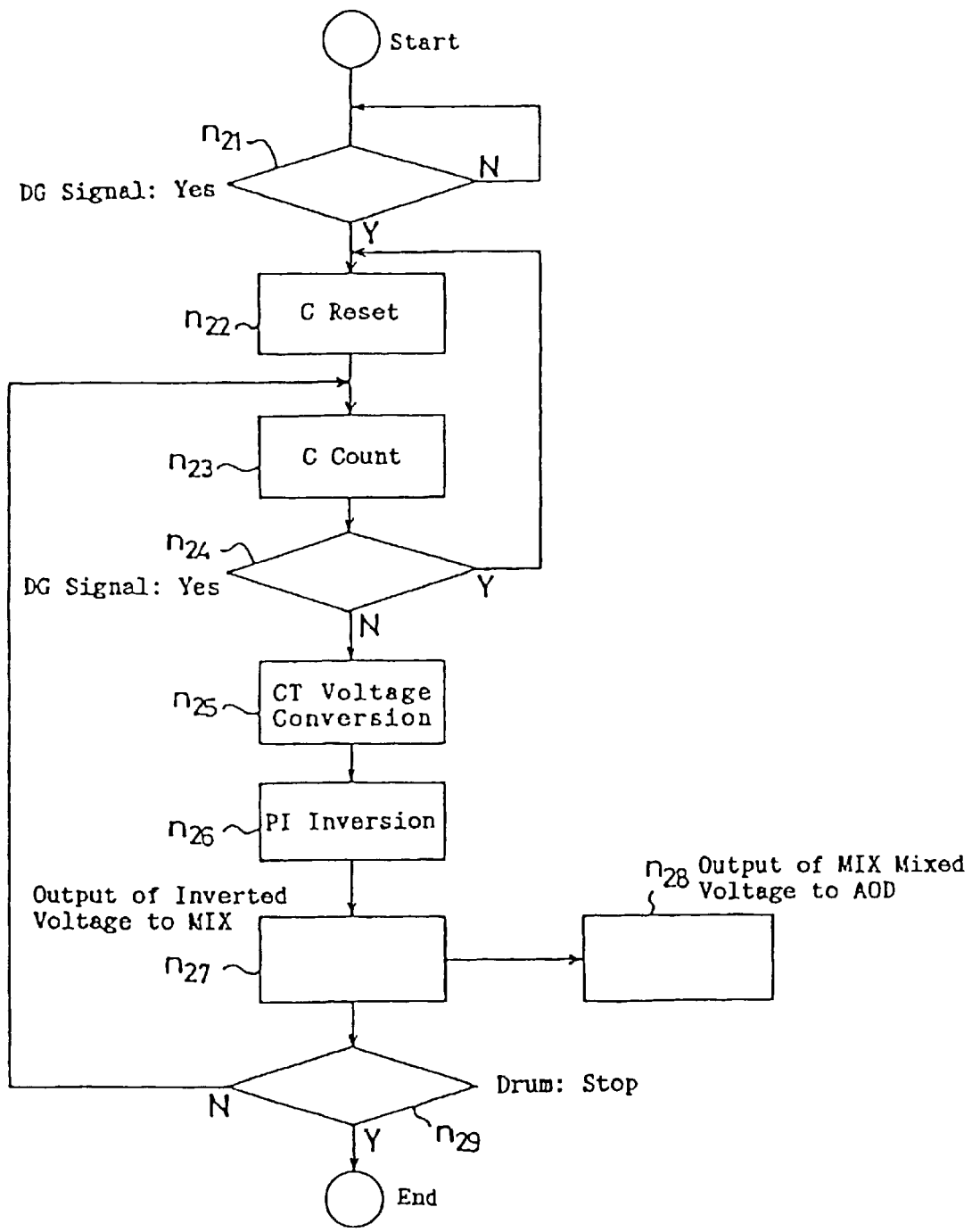
FIG. 11 is a flow chart showing the process in a incline distortion offsetting signal generating circuit YG of the second example.
Figure 12:
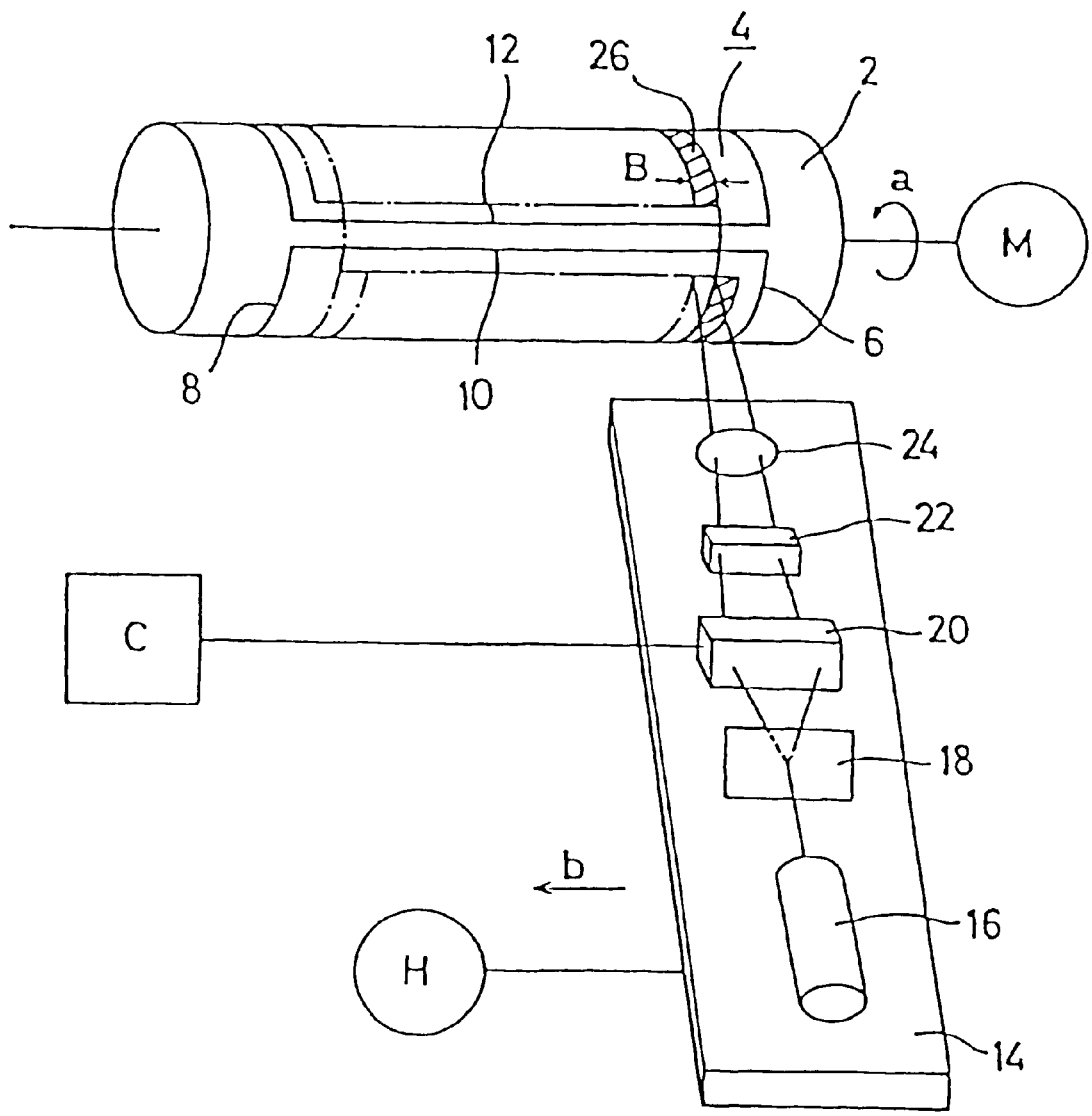
FIG. 12 is a schematic diagram of a prior art apparatus for the exposure of printing plates.
Figure 13:
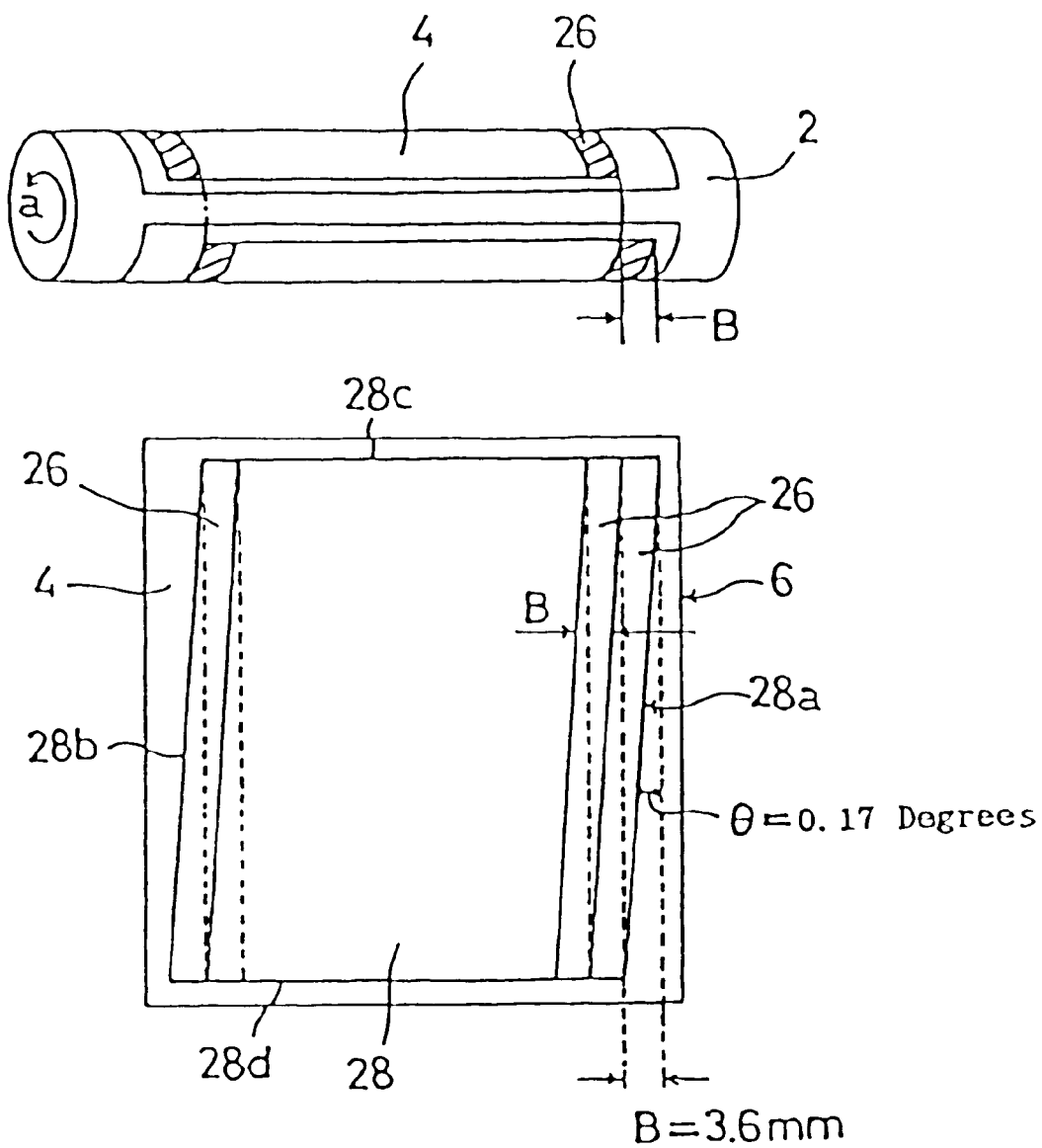
FIG. 13 is a schematic illustration showing how the recorded image is tilted and distorted on the printing plate in the apparatus shown in FIG. 12.
Figure 14:
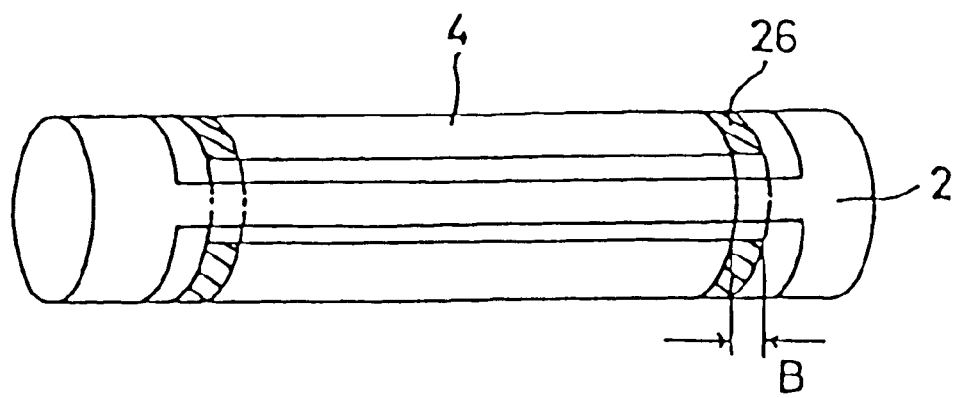
FIG. 14 is an explanatory diagram showing that intermittent moving of the exposing means can avoid distortion of image recorded frame.
Figure 14:
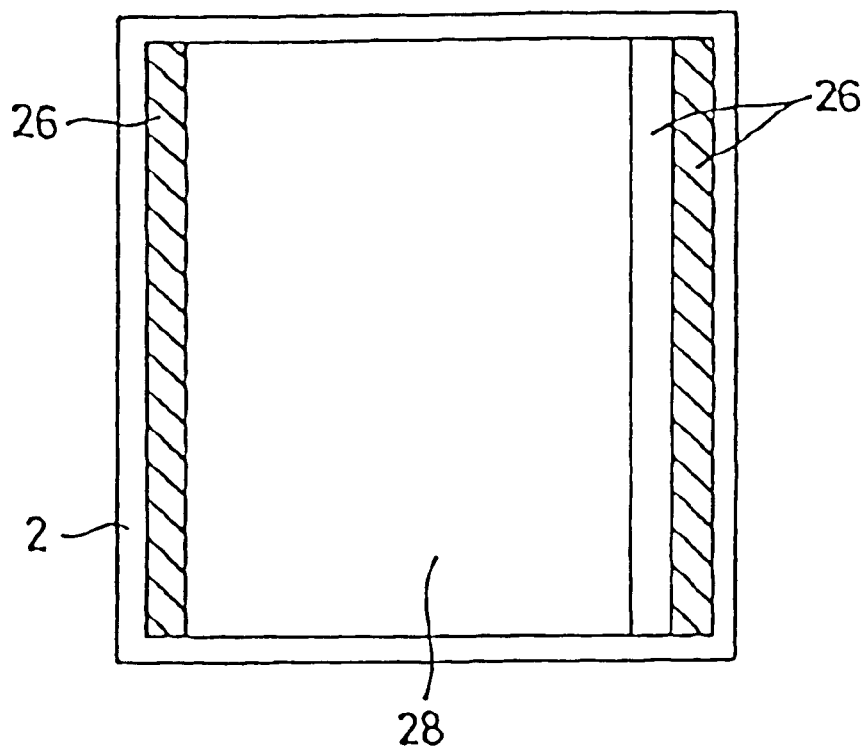

FIG. 11 is a flow chart of the operation of the incline distortion offsetting signal generating circuit YG. If a DG signal is transmitted in Step n21 which gives a position to start dotting or recording on the band, the counter C is reset (n22). The counter C counts the timing signal (n23) which is output at every 128th pulse of the standard clock generator CG. The pulse count is converted into a voltage proportional to that pulse count (n25). The sign (plus or minus) of that voltage is inverted (n26). The inverted voltage is output to the mixing circuit MIX (n27).

The inverted voltage gradually rises and is output to the circuit MIX until the next DG signal comes up (n24). Each time the count of pulses that come from the standard clock generator CG reaches 128, the inverted voltage is renewed. There will be no renewal until that point. Hence, while the 128-dot band width is being recorded, the incline distortion offsetting signal (YG signal) is maintained at a fixed level, and when the recording on the next band is started, the YG signal is renewed. With the recording on the printing plate completed, the drum comes to a stop (n23) to bring this process to a close.

Finally, the MIX signal, a mixture of XG and YG signals, is input in AOD 23 (FIG. 6) to control and deflect the laser beam in Step n28.

In this second example, the sawtooth wave band forming signal (XG signal) and the incline distortion offsetting signal (YG signal) are formed by the counters. In place of that, other known electronic circuits may be used.

The aforesaid moving mechanism H is configured to move the optical unit 14 on which an exposing means is mounted. Instead, a moving mechanism H may be provided on the drum so as to move the drum itself in the opposite direction to the arrow b. Another alternative may be provision of a moving mechanism H on both drum 2 and optical unit 14 to move the two simultaneously. It is noted that if the drum 2 and the exposing means are relatively moved by a distance of one band width for one revolution of the drum, a distortion-free recording operation can be conducted. While it is preferably fixed, the moving velocity can fluctuate if the number of revolutions of the drum per unit time of the drum changes, because that moving distance per revolution of the drum is set to a distance of one band width. It may also be so arranged that the exposing means alone is moved with the optical unit 14 itself fixed or the exposing means is moved along with part of the optical system.

In the preceding examples, the printing plate 4 is wound around the outer circumferential surface of the drum 2. Instead, the printing plate 4 may be wound around the inner circumferential surface of the drum 2. This version is called the inside surface type. In this type, a lens and a mirror are so mounted on the shaft of the drum 2 that a bundle of light rays from the exposing means is reflected to record an image band. In the inside surface type, the optical unit can be housed inside the drum, which contributes to size reduction.

In the first example, the laser beam from the laser source 16 is split into a multi-beam, and a light source array 22 comprising optical fibers is used. A light-emitting diode may be used in place of the laser source. I n this approach, it is so arranged that a light source array with a number of light-emitting diode elements arranged in a line is provided and switch-controlled by image signals from the computer C. This so-called diode array is applicable to the present invention if the light energy output is increased. The light source array technique in which the multi-beam is used has an advantage in that a band-width of information can be simultaneously recorded on the band having, e.g., 128 dots in the band-width if a light source array for 128 beams is provided.

In the second example, the single beam system is used. In that example, an acoustical-optical deflector (AOD) is used as exposing means. The AOD is an exposing means that changes the lattice interval using high frequency to deflect the incident beam for scanning. That is, it involves no mechanical parts and therefore is high in stability. Instead of an AOD, it is possible to utilize the vibration mirror used in the first example. This vibration mirror is mounted on the shaft of a vibration motor or a galvanometer. The mirror is vibrated right and left within a very small angle range to record information on the band. The same effect as from an AOD can be attained if the vibration mirror is vibrated by the MIX signal, a mixture of XG and YG signals.

In the present invention, the incline distortion offsetting signal shifts the starting point of recording a band-width information as recording proceeds in the longitudinal direction, thus offsetting the tilting of the band resulting from spiral recording. Thus, the present invention permits formation of a properly recorded quadrangular image in the printing plate without the need of cyclically moving and stopping the optical unit. There will be caused no such distortion as can be observed on close examination in mass-printed matters in the past. At the same time, the time necessary to prepare images for printing is shortened, a result that is particularly appreciated in the field of newspaper publication. Thus, as illustrated, the present invention can achieve highly practical results.

While the invention has been described with reference to specific embodiments thereof, it is to be understood that the invention is not limited thereto and that variations and/or changes in designs and arrangements are possible without departing from the spirit or scope of the invention.

What is claimed is:

1. An apparatus for exposing a printing plate wound around a drum to spirally record image information therein in the form of band strips, with a plurality of image elements record in a band width, in a multi-beam system for simultaneously recording image date of one band width, said apparatus comprising:

a printing plate wound around a drum in the form of a right circular cylinder, an exposing means comprising a vibration mirror to record image information in the form of a band strip on said printing plate by means of a light beam, a moving mechanism to move said exposing means comprising a vibration mirror in relation to said drum in the direction of the drum axis by a distance of one band width per revolution of the drum, and a circuit to generate an incline distortion offsetting signal in a sawtooth wave pattern having the same cycle a that of the rotation of the drum with the initial position of recording on the band as starting point, wherein said incline distortion offsetting signal is applied to the exposing means comprising a vibration mirror to deflect the light beam in sequence in the opposite direction to the moving direction of said moving mechanism until the light beam is distorted by one band width per revolution of the drum, thereby recording an undistorted complete printing image.

2. The apparatus for exposing a printing plate as defined in claim 1, wherein said moving mechanism moves said exposing means at a fixed rate in the direction of the drum axis in relation to a stationary drum.

3. The apparatus for exposing a printing plate as defined in claim 1, wherein said printing plate is wound around the outer circumferential surface of said drum.

4. The apparatus for exposing a printing plate as defined in claim 1, wherein said light beam is a laser beam or a light beam of a light emitting diode.

5. An apparatus for exposing a printing plate wound around a drum to spirally record image information therein in the form of band strips, with a plurality of image elements recorded in a band width, in a single beam system for recording image data of one band width dot by dot, comprising:

a printing plate wound around a drum in the form of a right circular cylinder, an exposing means comprising an acoustic-optical deflector to record image information in the form of a band strip on said printing plate by means of a light beam, a moving mechanism to move said exposing means comprising the acoustic-optical deflector in relation to said drum in the direction of the drum axis by a distance of one band width per revolution of the drum, a circuit to generate an incline distortion offsetting signal in a sawtooth wave pattern having the same cycle as that of the rotation of the drum with the initial position of recording on the band as starting point, and a deflection signal generating circuit which causes the single beam to vibrate and to be deflected with one band width being one cycle, wherein a mixture signal of a deflection signal from said deflection signal generating circuit and said incline distortion offsetting signal is applied to the exposing means comprising the acoustic-optical deflector to deflect the light beam in sequence in the opposite direction to the moving direction of said moving mechanism until the light beam is distorted by one band width per revolution of the drum, thereby recording an undistorted complete printing image.

6. The apparatus for exposing a printing plate as defined in claim 5, wherein said moving mechanism moves said exposing means at a fixed rate in the direction of the drum axis in relation to a stationary drum.

7. The apparatus for exposing a printing plate as defined in claim 5, wherein said printing plate is wound around the outer circumferential surface of said drum.

8. The apparatus for exposing a printing plate as defined in claim 5, wherein said light beam is a laser beam or a light beam of a light emitting diode.

* * * * *